(12) United States Patent
Liao et al.

(10) Patent No.: US 7,460,568 B2
(45) Date of Patent: Dec. 2, 2008

(54) APPARATUS AS TUNING FILTER

(75) Inventors: Jen-Chuen Liao, Hsinchu (TW); Hong-Xi Cao, Hsinchu (TW); Cheng-Fa Chen, Hsinchu (TW); Ricky Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 441 days.

(21) Appl. No.: 11/238,041

(22) Filed: Sep. 29, 2005

(65) Prior Publication Data
US 2006/0140229 A1 Jun. 29, 2006

(30) Foreign Application Priority Data
Dec. 27, 2004 (TW) ............................... 93140740 A

(51) Int. Cl.
*H01S 3/10* (2006.01)
*H01S 3/08* (2006.01)

(52) U.S. Cl. .............................. 372/20; 372/92; 372/107

(58) Field of Classification Search .................... 372/20, 372/92, 107
See application file for complete search history.

(56) References Cited

U.S. PATENT DOCUMENTS

| 4,229,710 A | 10/1980 | Shoshan |
| 5,452,314 A | 9/1995 | Aronson |
| 5,636,059 A | 6/1997 | Snyder |
| 5,804,813 A | 9/1998 | Wang et al. |
| 6,108,355 A | 8/2000 | Zorabedian |
| 6,600,760 B1 | 7/2003 | Green et al. |
| 2002/0118370 A1* | 8/2002 | Nishida ....................... 356/515 |
| 2004/0004751 A1* | 1/2004 | Vilhelmsson ................ 359/245 |
| 2004/0004979 A1* | 1/2004 | Lin .............................. 372/20 |
| 2004/0264515 A1* | 12/2004 | Chang et al. ................... 372/20 |
| 2006/0114476 A1* | 6/2006 | Kakuchi et al. ............. 356/515 |
| 2008/0013167 A1* | 1/2008 | Nahm et al. ................. 359/364 |

\* cited by examiner

*Primary Examiner*—Minsun Harvey
*Assistant Examiner*—Phillip Nguyen
(74) *Attorney, Agent, or Firm*—Harness, Dickey & Pierce, P.L.C.

(57) ABSTRACT

An apparatus as a tuning filter is provided for tuning the wavelength of a laser or a filter between extensive bandwidths, including a reflecting element, an optical system and a movable mount set up in the same optical path in order. The optical system focuses light on the reflecting element that induces dispersion effect. The reflecting element moves along an optical path as a spatial filter. The reflecting element is set up on the movable mount that moves along the optical path to push/pull the reflecting element and then to adjust the moving range of the reflecting element.

13 Claims, 5 Drawing Sheets

APPARATUS AS TUNING FILTER

BACKGROUND

This Non-provisional application claims priority under 35 U.S.C. § 119(a) on Patent Application No(s). 93140740 filed in Taiwan on Dec. 27, 2004, the entire contents of which are hereby incorporated by reference.

FIELD OF INVENTION

The invention generally relates to an apparatus as tuning filter, and in particular relates to an apparatus as tuning filter for tuning the wavelength of a laser between extensive bandwidth.

RELATED ART

Laser is a significant invention in twentieth century. It gives deep and wide influences to human lives. Many related developments of laser technology help laser applications in science, industry, medical service, bio-technology, examination, communication, automatic control, information storage, hologram, light sources and other domains. It gives important contributions to the national defense, modernization and human society progress. Gradually, besides a stronger power, people require the laser wavelength controllability and the stability more and more in order to apply to each domain. Particularly in the domains of atomic physics and communication, the laser wavelength requirements are severe.

Generally, a tunable laser module utilizes wavelength-dependent optical mechanisms in the laser cavity to adjust the gains of different wavelengths and gets a single-mode laser output by the competitive mechanism of laser. In other words, a wavelength tuner is applied in the laser device to change the wavelength of laser output. Nowadays though the laser wavelength-tuning technology being mature, there are still many insufficiencies to be improved.

In the prior arts, the most common wavelength-tuning uses dispersive elements, such as diffraction gratings or prisms, to separate the light of different wavelength. For example, in the U.S. Pat. No. 4,229,710 as shown in FIG. 1, a light passes the lens 110 and stimulates an excited medium 120 to emit a beam traveling between a reflector 130 and a wavelength selector 140 that work as a resonance cavity for the stimulated light 150. The wavelength selector 140 includes a reflecting surface 142 and a diffraction grating 144. A partial light 152 of the emitted light 150 diffracts to the reflecting surface 142 when bounces off the diffraction grating 144. The survived partial light 154 is amplified after multiple round-trips as the laser output. The laser wavelength is determined by positions of the reflecting surface 142 and the diffraction gratings 144. In other words, wavelength-tuning is accomplished by rotating this reflecting surface 142, while the grating 144 remains fixed.

Another common wavelength-tuning is to apply interference elements (etalon) activated by thermal, electrical or mechanical control methods. For example, in U.S. Pat. No. 6,600,760 as shown in FIG. 2, along an optical path there is a retro-reflector 210, an interference filter 230, a grid generator 240, a cavity-coupling lens 220, a laser medium 250 and a coupling optics 222 mounted coaxially. The interference filter 230 and the grid generator 240 are used for selecting the wavelength of stimulated light generated by the laser medium 250. Thermal controlled channel tuner 260 and grid control 262 are coupled with the interference filter 230 and the grid generator 240 for changing the wavelength.

In addition, using acousto-optic (AO), electro-optic (EO) or magneto-optic (MO) effect that interdependent to the wavelength can achieve a light-dispersion mechanism. For example, in U.S. Pat. No. 5,452,314 as shown in FIG. 3, a transducer 320 and a pair of electrodes 330 are mounted on a base 310 of an acousto-optic material 310. The transducer 320 is responsive to an electrical signal provided by an external voltage source 340 to induce an acoustic wave. The frequency of the acoustic wave and the optical properties of the base 310 define an optical frequency band. A waveguide 350 is formed in an upper surface of the base 310 to guide a light beam from one end of the base 310 to the other end. The acoustic wave changes the polarization mode of any light having a frequency within the defined optical frequency band. The pair of electrodes 330 set on two sides of the waveguide 350 are controlled by a voltage source 360 to generate an electric field that extends through the waveguide 350, adjust the birefringence of the acousto-optic material of the base 310. Therefore, when applying different voltage, different refractive index works as a filter to achieve the wavelength tuning.

Further, we can apply some kind of gain media like quantum dot to amplify the feedback and control different wavelength of light. For example, in U.S. Pat. No. 6,108,355 as shown in FIG. 4, when a tuner 410 receives a feedback signal, a translator 420 activates two wedge-shaped air-gap etalon and corrective elements 430, 440 to expand or constrict and cause the light beam 450 passing through the corrective elements 430, 440 and changing the wavelength.

The aforesaid tuning mechanisms have their disadvantages, such as large tuning elements, slow tuning speed, poor efficiency or difficult assembly. Most of them are limited to the size of actuators, such as small stepping motor or micro-electromechanical systems (MEMS).

U.S. Pat. No. 5,636,059 discloses a microlens tunable laser. As shown in FIG. 5, a microlens tunable laser diode assembly is rigidly attached to an annular microlens mount 532. The mount 532 is rigidly mounted to a washer-shaped PZT structure 540 that provides the necessary translational range for mode selection and/or frequency tuning. Laser diode 510 has a header/heatsink 512 that is attached to a flange 514. The laser beam 520 passing through the optical assembly 530 is activated by the PZT structure 540 for changing its wavelength. However, the optical assembly 530 is easy to cause different wavelength competition. And, the side-mode suppression ratio (SMSR) of the output spectrum is low.

Therefore, it is desired to have a better solution for a laser tuning apparatus that can prevent from the aforesaid problems.

SUMMARY

In view of the foregoing, an object of the invention is to provide an apparatus as tuning filter to solve existing problems in prior arts.

The disclosed apparatus as tuning filter has many advantages, e.g. fast tuning the wavelength, high efficiency of the laser, easy size-minimization and simple tuning technology.

The disclosed apparatus as tuning filter may utilize the tuning function with a smaller displacement to implement the function of tuning the wavelength.

The disclosed apparatus as tuning filter may be applicable to various filters and various lasers, and have a wide range tuning.

To achieve these and other advantages and in accordance with the purpose of the invention, as embodied and broadly described, an apparatus as tuning filter according to the invention includes a movable mount, a reflecting element and an optical system being set up in the same optical path in order. The optical system focuses light on the reflecting element that induces dispersion effect. The reflecting element moves along an optical path as a spatial filter. The reflecting element is set up on the movable mount that moves along the optical path to push/pull the reflecting element and to adjust the moving range of the reflecting element.

The optical system includes at least a lens. The reflecting element is a reflecting surface or a spherical concave mirror with a pinhole on the spherical center for retro-reflection.

The wavelength tuning apparatus of the invention further includes a gain medium for generating and amplifying light beam. The movable mount, the reflecting element and the gain medium are set up in the same optical path in order.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
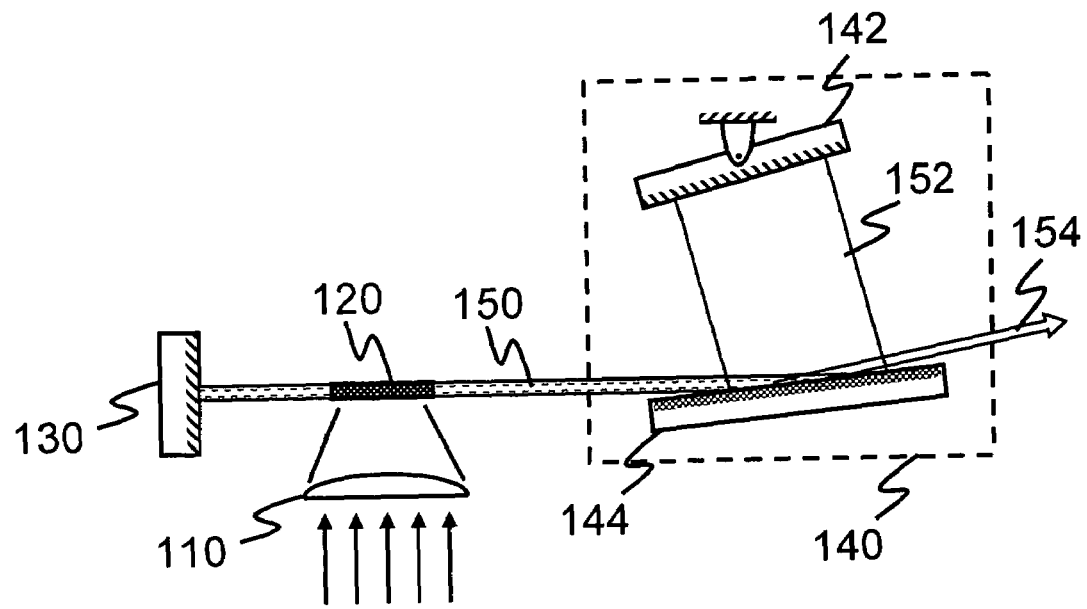
FIG. 1 is a constructional view of a wavelength tuning apparatus of first prior art.
Figure 2:
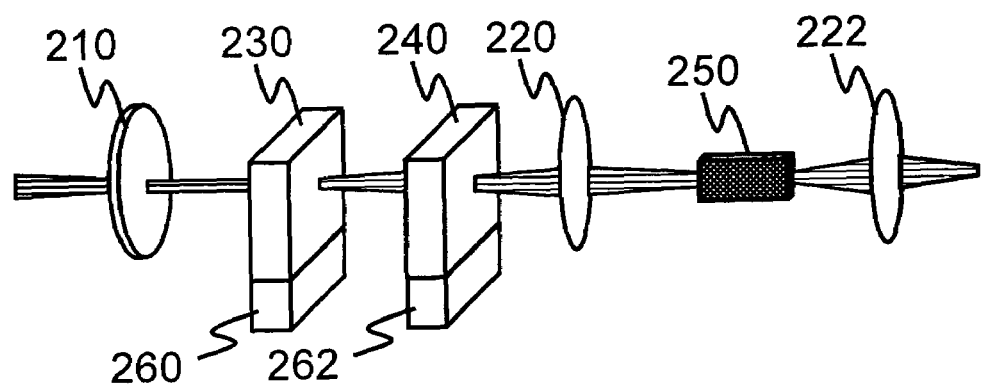
FIG. 2 is a constructional view of a wavelength tuning apparatus of second prior art.
Figure 3:
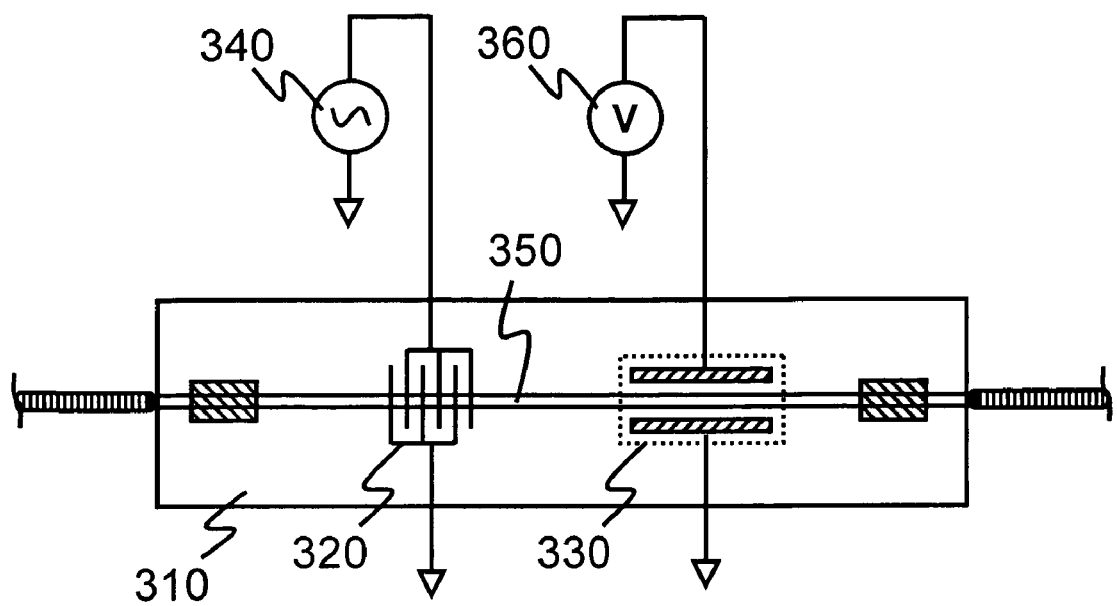
FIG. 3 is a constructional view of a wavelength tuning apparatus of third prior art.
Figure 4:
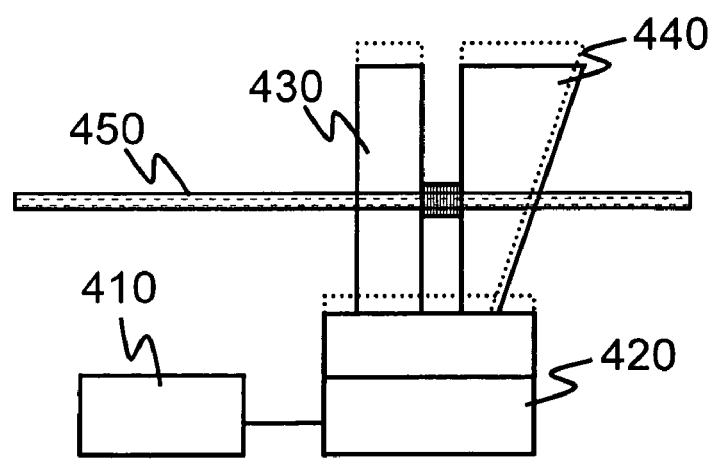
FIG. 4 is a constructional view of a wavelength tuning apparatus of fourth prior art.
Figure 5:
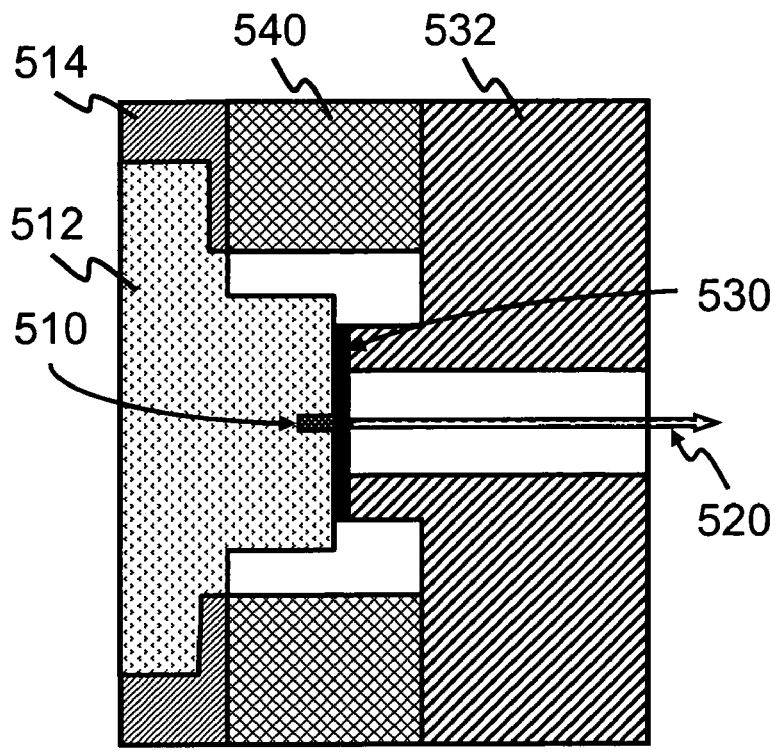
FIG. 5 is a constructional view of a wavelength tuning apparatus of fifth prior art.
Figure 6:
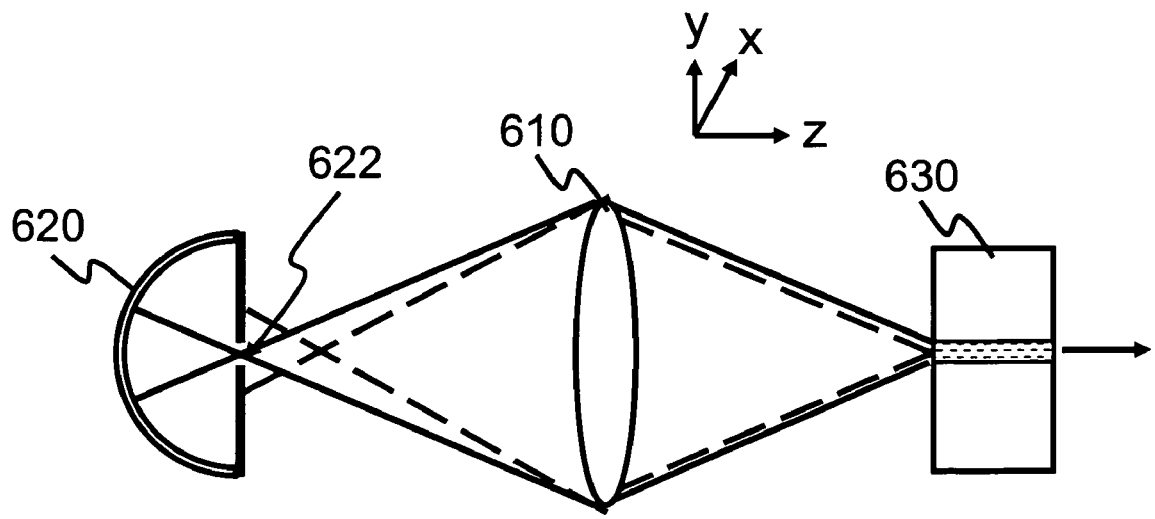
FIG. 6 is a schematic view showing the system for tuning wavelength according to a main conception of the invention.

FIG. 6 is a schematic view showing an apparatus as tuning filter. The invention mainly applies a highly dispersive lens 610 to focus different wavelengths to different focal points on a z-axis; applies an aperture 622 approaching the size of the focal point as a spatial filter to filter photons of a specific wavelength; and uses the photons for feedback control of a band-pass filter to tune the laser wavelength.

Several embodiments of the invention are described below in accompany with the correspondent drawings.

Figure 7A:
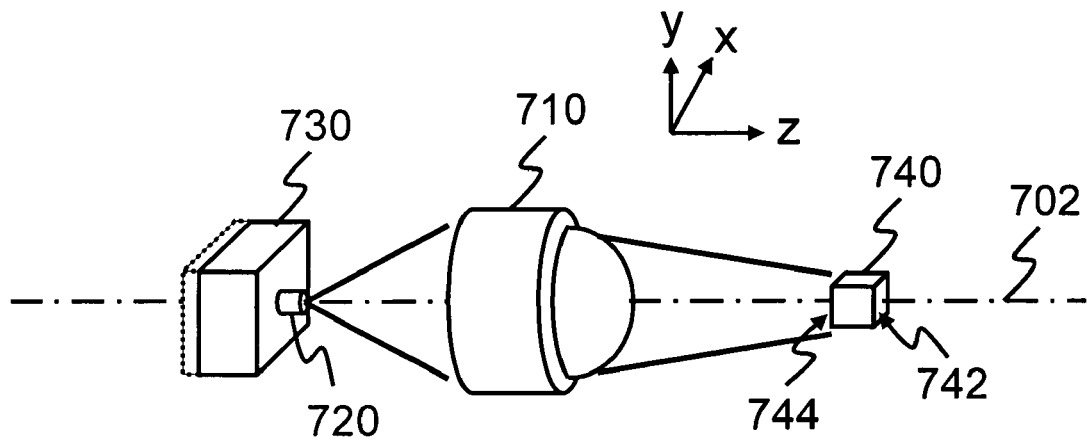
FIG. 7A is a schematic view showing a construction and an optical path of an apparatus as tuning filter according to first embodiment of the invention.

Please refer to FIG. 7A, a first embodiment of the invention. A partial reflecting surface 742 of a gain medium 740 and a reflecting element 720 define a laser cavity. The optical system 710 provides high dispersion so that the rays passing through the full penetration surface 744 from the gain medium 740 are focused to a plurality of focal points on the z-axis according to their different wavelengths. The reflecting element 720 is a reflecting surface. When the reflecting element 720 moves along the z-axis, a spatial filter effect is induced to acts as a wavelength tuning of a band-pass filter or a feedback control of the laser. That is, a focal point of a specific wavelength falls on the reflecting element 720 when the reflecting element moving to a specific position. The reflecting element 720 is set up on a movable mount 730 that moves along the optical path to adjust the position of the reflecting element 720 and to highly reflect specific wavelengths at individual specific positions.

The movable mount 730 is made of a suitable piezoelectric element corresponding to the moving range and dispersion length. The piezoelectric movable mount 730 has a moving range covering the dispersion range of the laser rays so as to adjust the band-pass filter and tune the laser wavelength. Other micro-motion actuators, such as mechanical slides, lead screws, micro-electromechanical systems, heating elements, cooling elements, magnetic force, electrostatic force, hydraulic or pneumatic actuators, can be used for the movable mount 730.

The gain medium 740 is a semiconductor or solid, gas, excimer, photonic crystal or fiber laser, such as GaN GaP GaInP AlGaInP GaAs Ar Kr $CO_2$ $O_2$ $N_2$ He-Ne Er Nd doped YAG and so on. The partial reflecting characteristics of the partial reflecting surface 742 are determined according to the characteristics of the laser output.

Figure 7B:
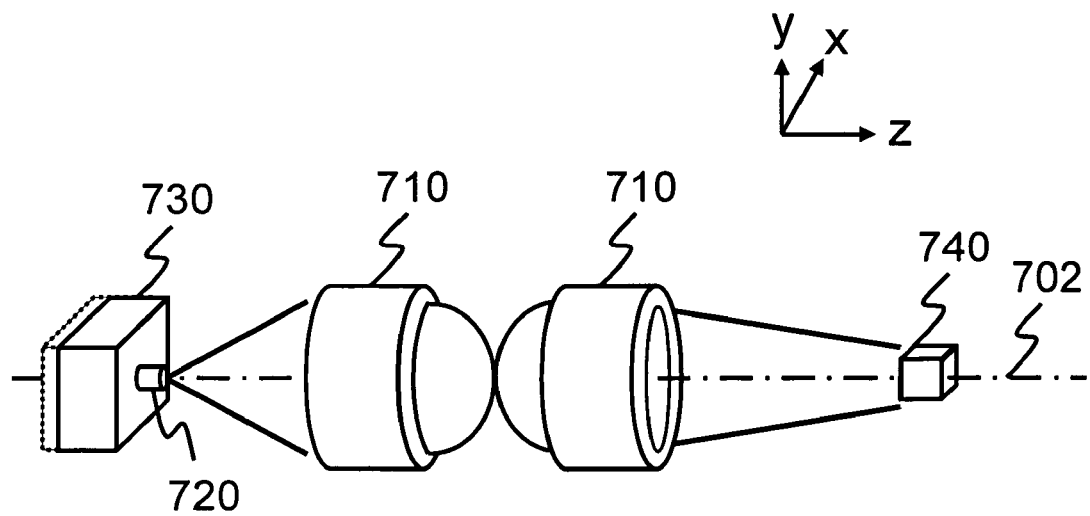
FIG. 7B is a schematic view showing a construction and an optical path of the apparatus as tuning filter according to second embodiment of the invention.

The optical system 710 is a lens or lens assembly as shown in FIGS. 7A and 7B. That is, the optical system can be a lens or be composed of several lenses. The lens has high dispersion effect. That lens can be spherical lens, graded-index lens, Fresnel lens or aspheric lens.

Figure 7C:
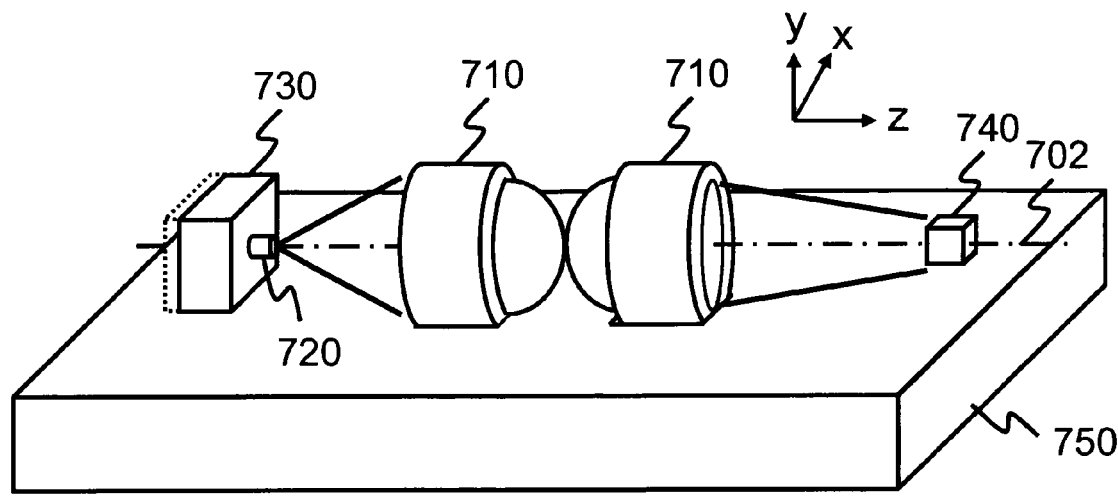
FIG. 7C is a schematic view showing a construction and an optical path of the apparatus as tuning filter according to third embodiment of the invention.

There is further a base 750 to fix the elements, as shown in FIG. 7C.

Figure 7D:
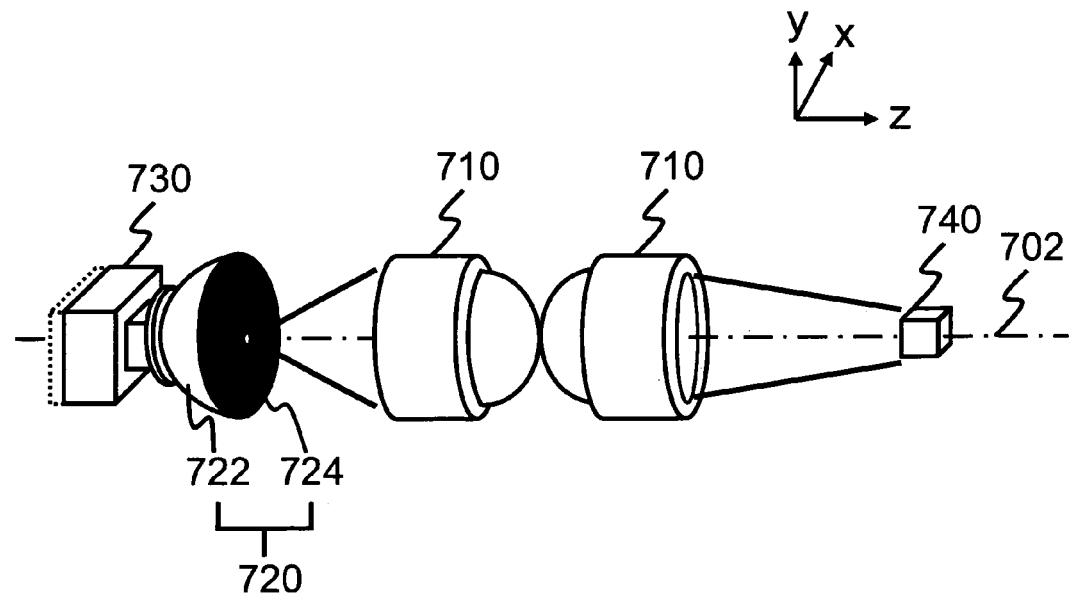
FIG. 7D is a schematic view showing a construction and an optical path of the apparatus as tuning filter according to fourth embodiment of the invention.

As shown in FIG. 7D, the reflecting element 720 is a spherical concave mirror 722 cooperated with a pinhole 724. The pinhole 724 is located on the spherical center. The pinhole 724 can be a small hole formed on a cover of the spherical concave mirror 722. When a focal point falls on the pinhole, the spherical concave mirror 722 provides higher reflection to the specific wavelength ray. Therefore, the pinhole serves as a spatial filter.

In construction, the whole apparatus of the invention is to arrange the movable mount 730, the reflecting element 720, the optical system 710 and the gain medium 740 on the same optical path 702 on the z-axis.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus as tuning filter, comprising:
   a reflecting element, linearly movable along an optical path;
   an optical system, for focusing a light into a plurality of focal points substantially falling within a moving range of the reflecting element on the optical path based on a plurality of wavelengths of the light; and a movable mount, connected with the reflecting element, for moving the reflecting element along the optical path; wherein the movable mount, the reflecting element and the optical system are set up in order in the optical path and when one of the focal points falls in the reflecting element, the reflecting element reflects the light with the wavelength corresponding to the focal point falling in the reflecting element, wherein the reflecting element includes:

a pinhole as small as needed for enhancing a mode selection; and a spherical concave mirror having a spherical center superposed on the pinhole for reflecting the light with the wavelength corresponding to the focal point falling in the pinhole.

2. The apparatus as tuning filter of claim 1 wherein the optical system comprises a lens with a high dispersion for focusing the wavelengths of the light.

3. The apparatus as tuning filter of claim 2 wherein the lens is selected from the group consisting of spherical lens, graded-index lens, Fresnel lens, and aspheric lens.

4. The apparatus as tuning filter of claim 1 wherein the optical system comprises a lens assembly with a high dispersion for focusing the wavelengths of the light.

5. The apparatus as tuning filter of claim 4 wherein the lens assembly is selected from the group consisting of spherical lenses, graded-index lenses, Fresnel lenses, aspheric lenses and any assembly thereof.

6. The apparatus as timing filter of claim 1 wherein the reflecting element is a reflecting surface having a size as small as needed for enhancing a mode selection.

7. The apparatus as tuning filter of claim 1 wherein the pinhole is formed on a cover of the spherical concave mirror.

8. The apparatus as tuning filter of claim 1 wherein the movable mount is a micro-motion actuator.

9. The apparatus as tuning filter of claim 8 wherein the micro-motion actuator is selected from the group consisting of mechanical slide, lead screw, micro-electromechanical system, heating element, cooling element, magnetic force, electrostatic force, hydraulic, pneumatic actuators and any combination thereof.

10. The apparatus as tuning filter of claim 1 further comprises a gain medium for emitting the light, wherein the movable mount, the reflecting element, the optical system and the gain medium are set up in order along the optical path.

11. The apparatus as tuning filter of claim 10 wherein the gain medium has a full penetration surface adjacent the optical system; and a partial reflecting surface far away from the optical system.

12. The apparatus as tuning filter of claim 10 wherein a reflecting characteristic of the partial reflecting surface is determined by a characteristic of a laser output.

13. The apparatus as tuning filter of claim 10 wherein the gain medium is selected from the group consisting of a semiconductor laser, a solid medium, a gas medium, an excimer, a waveguide, a photonic crystal, a fiber laser and an any combination thereof.

* * * * *